(12) United States Patent
Giraudo et al.

(10) Patent No.: US 9,300,269 B2
(45) Date of Patent: Mar. 29, 2016

(54) FILTER THAT IS VARIABLE BY MEANS OF A CAPACITOR THAT IS SWITCHED USING MEMS COMPONENTS

(75) Inventors: Michel Giraudo, Gennevilliers (FR); Marie-Pierre Dussauby, Gennevilliers (FR); Gilles Neveu, Gennevilliers (FR)

(73) Assignee: Thales, Courbevoie (FR)

( * ) Notice: Subject to any disclaimer, the term of this patent is extended or adjusted under 35 U.S.C. 154(b) by 226 days.

(21) Appl. No.: 13/977,492

(22) PCT Filed: Dec. 22, 2011

(86) PCT No.: PCT/EP2011/073813
§ 371 (c)(1),
(2), (4) Date: Nov. 5, 2013

(87) PCT Pub. No.: WO2012/089619
PCT Pub. Date: Jul. 5, 2012

(65) Prior Publication Data
US 2014/0176263 A1    Jun. 26, 2014

(30) Foreign Application Priority Data
Dec. 30, 2010   (FR) ..................................... 10 05182

(51) Int. Cl.
*H01P 1/203* (2006.01)
*H03H 7/01* (2006.01)
(Continued)

(52) U.S. Cl.
CPC ............. *H03H 7/0138* (2013.01); *H01P 1/203* (2013.01); *H01P 1/20336* (2013.01); *H03H 7/00* (2013.01);
(Continued)

(58) Field of Classification Search
CPC ...... H03H 6/0138; H03H 7/0138; H03H 7/00; H03H 7/0123; H03H 7/1766; H03H 7/1775; H03H 7/38; H01P 1/20336
USPC .......................................................... 333/32
See application file for complete search history.

(56) References Cited

U.S. PATENT DOCUMENTS 5,485,131 A    1/1996  Fajen et al.
7,385,465 B2 *  6/2008  Chen ............................ 333/175
(Continued)

FOREIGN PATENT DOCUMENTS

EP        1329977 A1    7/2003
EP        1953914 A2    1/2008
KR   2001-0094509 A    11/2001

OTHER PUBLICATIONS

Zhu et al., "Adjustable Bandwidth Filter Design Based on Interdigital Capacitors", IEEE Microwave and Wireless Components Letters, IEEE Service Center, vol. 18, No. 1, Jan. 2008, pp. 16-18.
(Continued)

*Primary Examiner* — Stephen E Jones
*Assistant Examiner* — Scott S Outten
(74) *Attorney, Agent, or Firm* — Baker & Hostetler LLP

(57) ABSTRACT

A tunable filter comprises at least two resonator circuits placed between two matching networks characterized in that: one resonator is connected at a first of its ends to the ground plane M of the filter by metallized holes and at a second end to a MEMS network; the distance between the two resonators forms an inter-resonator inductive coupling circuit; an inter-resonator coupling capacitor is formed by two etched lines connected to the first and second resonators; the MEMS networks are distributed around the ends of the resonators; the MEMS networks are connected between the first and second resonator and the ground plane M by means of metallized holes; and the filter comprises a number of independent electrical control voltages designed to actuate the MEMS.

5 Claims, 6 Drawing Sheets

(51) Int. Cl.
*H03H 7/00* (2006.01)
*H03H 7/38* (2006.01)

(52) U.S. Cl.
CPC .......... *H03H 7/0123* (2013.01); *H03H 7/0153* (2013.01); *H03H 7/1766* (2013.01); *H03H 7/1775* (2013.01); *H03H 7/38* (2013.01); *H03H 2007/008* (2013.01); *H03H 2210/025* (2013.01)

(56) References Cited

U.S. PATENT DOCUMENTS

| | | | |
|---|---|---|---|
| 8,363,380 B2* | 1/2013 | Lan et al. | 361/281 |
| 2002/0149448 A1 | 10/2002 | Toncich | |
| 2005/0017824 A1 | 1/2005 | Hirabayashi | |
| 2010/0184384 A1* | 7/2010 | Jones et al. | 455/67.11 |
| 2011/0002080 A1* | 1/2011 | Ranta | 361/277 |

OTHER PUBLICATIONS

Tang et al., "A Microstrip Bandpass Filter with Ultra-Wide Stopband", IEEE Transactions on Microwave Theory and Techniques, IEEE Service Center, vol. 56, No. 6, Jun. 2008, pp. 1468-1472.

El-Tanani et al., "Corrugated Microstrip Coupled Lines for Constant Absolute Bandwidth Tunable Filters", IEEE Transactions on Microwave Theory and Techniques, IEEE Service Center, vol. 58, No. 4, Apr. 2010, pp. 956-963.

* cited by examiner

FILTER THAT IS VARIABLE BY MEANS OF A CAPACITOR THAT IS SWITCHED USING MEMS COMPONENTS

CROSS-REFERENCE TO RELATED APPLICATIONS

This application is a National Stage of International patent application PCT/EP2011/073813, filed on Dec. 22, 2011, which claims priority to foreign French patent application No. FR 1005182, filed on Dec. 30, 2010, the disclosures of which are incorporated by reference in their entirety.

FIELD OF THE INVENTION

The subject matter of the present invention relates to a variable filter using capacitors switched by means of microelectromechanical systems (MEMS) components.

In the description, the expression "tunable filter" will be understood to mean a filter belonging to the family of passband filters produced from coupled oscillating (inductor/capacitor) circuits, said filters being configurable and adjustable.

Likewise, the term "jamming" is used to denote signals that disrupt the useful signal. The term "resonator" is used in the present invention to refer to resonant circuits, also called oscillator circuits. The term "interdigitated" is known in the art.

BACKGROUND

MEMS technology has allowed advances in microelectronics to be used to produce deformable microsystems the mechanical behavior of which modulates electrical behavior.

Various actuators and switches are described in the prior art. Thus, the prior art discloses MEMS structures that use a movable conductive element and a number of fixed current carrying contact terminals advantageously allowing a larger current to be carried relative to prior devices in which the current was made to flow through movable conductive elements. The fields of radio communication and radio navigation make use of low power transceiver filter systems for highly linear co-site filtering. Co-site or proximity operation is in particular obtained when a receiver capturing a weak signal is located nearby a high-power emitter.

Co-site filters have a very substantial impact on power consumption and bulk. Most of the systems currently used have the following problems:
  unsatisfactory filtering system linearity when received and filtered signal power varies;
  unsatisfactory band coverage depending on the application;
  unsatisfactory selectivity, which is necessarily improved by increasing quality factor;
  parasitic amplitude/phase modulation, which may appear depending on the amount of jamming at reception. This parasitic amplitude/phase modulation affects the measurement error, known by the acronym EVM (error vector magnitude), used to quantify the performance of a digital radio emitter or receiver; and
  substantial bulk and a substantial power consumption when live to RF power.

To solve these various problems it is known to use a varactor diode based filter, however varactor diodes are nonlinear components that have a low immunity to jamming. It is also known to use capacitors switched by relay or p-i-n (positive-intrinsic-negative) diode. However, switching times are too long for this type of switching. In the case where p-i-n diodes are used power consumption is high.

The various solutions known in the art do not adequately solve the following problems:
  the presence of an intentional or unintentional jamming signal at a frequency relatively near the frequency of the useful signal;
  the linearity of the filtering system whatever the frequency used.

The technical teachings of patent application US 2005/0017824 relate to a filter comprising two elements 8, 9 placed in parallel with each other and connected via a coupling element 18 that is a capacitor. The first conductor 8 and the second conductor 9 are rectangular features placed in parallel and spaced apart by a given distance. An element 10, which is a third conductor, is located between the first and the second elements 8, 9. The coupling capacitor 18 is connected to the two elements 8 and 9.

Document KR 2001 0094509, a summary of which is available in the Espacenet patent database, describes a microstrip capacitor.

The document entitled "adjustable bandwidth filter design based on interdigital capacitors" IEEE microwave and wireless components letters, pages 16-18, XP011199157 relates to microstrip filters.

The document entitled "a microstrip bandpass filter with ultra-wide stopband" IEEE transactions on microwave theory and techniques, pages 1468-1472, XP011215082 also describes a microstrip technology. FIG. 1 shows a filter structure that comprises a number of "open stubs" and "interdigital" capacitors.

The document entitled "corrugated microstrip coupled lines for constant absolute bandwidth tunable filters" IEEE transactions on microwave theory and techniques, Vol. 58, No. 4, (2010 Apr. 1), pages 956-963, XP011305950 for example shows a three-pole filter in FIG. 6. The idea in this paper is to demonstrate that "corrugated" microstrip lines can also be used to control coupling coefficient, enabling constant absolute bandwidth filtering. FIG. 8 shows a model of a miniaturized two-pole electrical circuit.

Patent EP 1 953 914 relates to a multiplexer and a diplexer.

Patent application US 2002/0149448 relates to a device allowing losses in ferromagnetic components to be characterized.

SUMMARY OF THE INVENTION

The subject matter of the present invention notably relates to a novel approach using MEMS components to switch between various capacitance values in a tunable filter. This advantageously enables adjustable or reconfigurable filtering or filtering with a filter the constant pass band of which can be tuned to a frequency using variable MEMS RF capacitors.

The invention relates to a tunable filter comprising at least two resonator circuits placed between a first matching network connected to a first input/output and a second matching network connected to a second input/output, said matching networks consisting of an inductor ($L_4$, $L_5$) and a capacitor ($C_4$, $C_5$) connected in parallel, and:
  one resonator is connected at a first of its ends on one side to the ground plane M of the filter by metallized holes and at a second end to a MEMS network;
  the distance d between the 2 resonators forms an inter-resonator inductive coupling circuit;
  an inter-resonator coupling capacitor is formed by 2 etched lines that are connected to the first and second resonators, respectively;

the MEMS networks are distributed around the ends of the resonators;

the MEMS networks are connected between the first and second resonator and the ground plane M by virtue of vias or metallized holes; and a number of independent electrical control voltages Vi designed to actuate the MEMS or MEMS network are employed.

The tunable filter according to the invention is, for example, produced in microstrip technology.

The filter having a feature at least described above is used in a receiver chain, said tunable filter being placed closest a receiving antenna and just before a low noise amplifier.

According to another embodiment, the tunable filter according to the invention is used in a receiver chain, said tunable filter being placed downstream of a low noise amplifier and of a high-field protection device and of an antenna.

The tunable filter may also be placed between a power driver or controller and an amplifier.

BRIEF DESCRIPTION OF THE DRAWINGS

Other features and advantages of the device according to the invention will become more clearly apparent on reading the following description of an embodiment given by way of non-limiting example and illustrated by the appended figures, in which.

DETAILED DESCRIPTION

The filter studied, an example of which is given by way of illustration to clarify the subject matter of the present invention, is a working 2 pole filter covering an octave with a constant passband over the entire tunable range.

Figure 1:
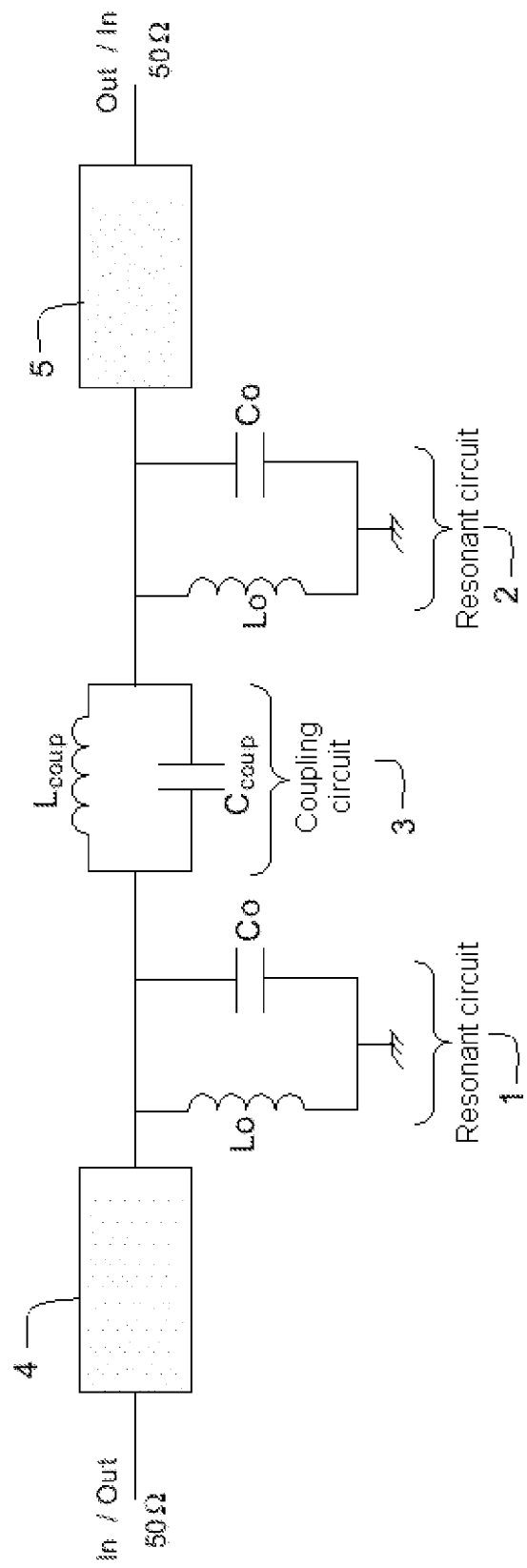
FIG. 1 is a basic diagram of the filter according to the invention.

FIG. 1 shows a basic diagram of a passband filter according to the invention having inputs/outputs denoted IN/OUT. The principle implemented is the use of coupled oscillating circuits.

The core of the device consists of two oscillating circuits 1, 2 having a self-inductance $L_0$ and a variable capacitance $C_0$. These two oscillating circuits 1, 2 or resonator circuits or resonators are coupled by a coupling circuit 3 produced by placing a coupling inductor $L_{coup}$ and a capacitor $C_{coup}$ in parallel in this embodiment.

The assembly consisting of the first coupling circuit 1 and the coupling circuit is connected to the input IN of the filter by a matching network 4, which converts an impedance of 50 ohms to the impedance required to achieve filtering with a constant bandpass, this being one of the advantages of the present device.

Symmetrically, an identical matching network 5 allows the output of the filter to be coupled to the second resonant circuit.

A matching network 4, 5 may consist of a fixed inductor with a capacitor in parallel coupled to the inductance $L_0$ of the resonant circuit via an intermediate connection, according to a model known to those skilled in the art, these elements not being shown in the figure for the sake of simplicity.

Correct matching to 50 ohms and the constancy of the passband at −3 dB depend on mathematical relationships between the elements of the matching circuit $L_0$, $C_0$, $L_{coup}$ and $C_{coup}$.

Figure 2:
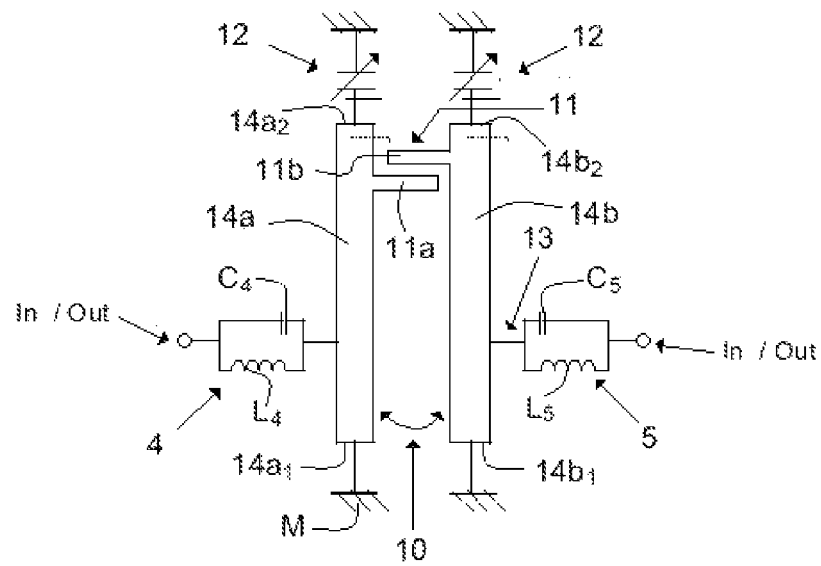
FIG. 2 is an example configuration of the MEMS filter according to the invention.

FIG. 2 shows an example filter configuration and schematically shows an example architecture using MEMS switched capacitors placed at the ends of the resonator or resonant circuit used in the diagram in FIG. 1. The configuration chosen in this example is a coupled line configuration employing inter-resonator inductive coupling 10, i.e. coupling between two resonators 14a and 14b, and a capacitive coupling 11 achieved via an interdigitated capacitor placed between the two resonators, this low capacitance value $C_{coup}$ of the coupling circuit 11 is formed from two coupled lines 11a, 11b that are narrower and closely spaced over a distance of a few mm and connected to the resonators 14a and 14b. The sum of these two types of coupling 10, 11 makes it possible to achieve a filter with an almost constant bandwidth.

Figure 3:
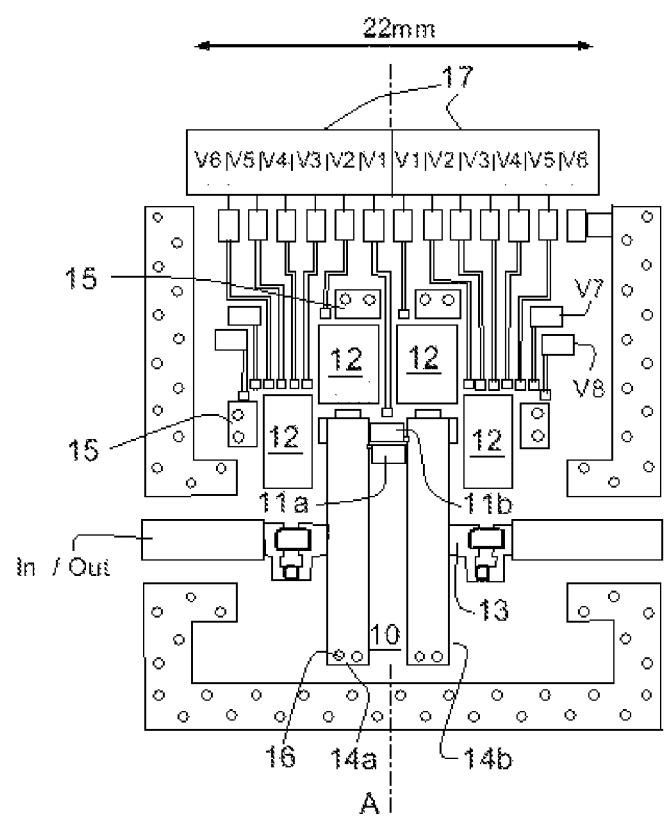
FIG. 3 is an embodiment of the filter according to the invention.

FIG. 3 shows a physical representation of the MEMS filter produced in microstrip technology. The lines of the circuit are etched on a substrate S. The other side of the circuit is a ground plane M (not shown in figure for the sake of simplicity) known to those skilled in the art. Input/output access IN/OUT is provided by lines etched on the substrate, of 50 Ω impedance, for example. The matching network 4, 5 is produced from a discreet inductor L4, L5 and capacitor C4, C5 soldered in parallel. The matching network 4, 5 is connected in series with the input/output line IN/OUT. These two components (inductor and capacitor) match the input/output access of the filter and the resonator 14a, 14b and thus allow harmonious and simple impedance conversion 13 between the 50 Ω access and the impedance of the resonator as there is a large impedance mismatch at this line intersection (13, IN/OUT). A resonator 14a, 14b is connected at a first of its ends 14a1, 14b1, respectively, on one side to a ground plane by metallized holes or vias 16 and at a second end 14a2, 14b2, respectively, to a MEMS network 12. The distance d between the two resonators (14a, 14b) creates the inter-resonator inductive coupling circuit 10. This distance is for example set using a simulation employing methods known to those skilled in the art, in order to obtain the desired conversion function for a given application of the tunable filter. The inter-resonator coupling capacitor 11 is formed by two small etched lines 11a, 11b that are connected to the resonator 14a, 14b. The widths of the lines 11a, 11b are for example set depending on the frequency of the filter and therefore on the intended application. The MEMS networks 12 are distributed around the ends of the resonators 14a, 14b in this embodiment, the distribution being chosen in order to group the various elements as much as possible. The MEMS networks 12 are connected between the resonator 14a, 14b and the ground plane M via the vias or metallized holes 15. 8 independent electrical control voltages V1 to V8 17 allow the MEMS 12 to be actuated. The actuation voltages are delivered to the MEMS by high-impedance lines. The filter schematically shown in FIG. 3 is symmetric about an axis A.

Figure 4:
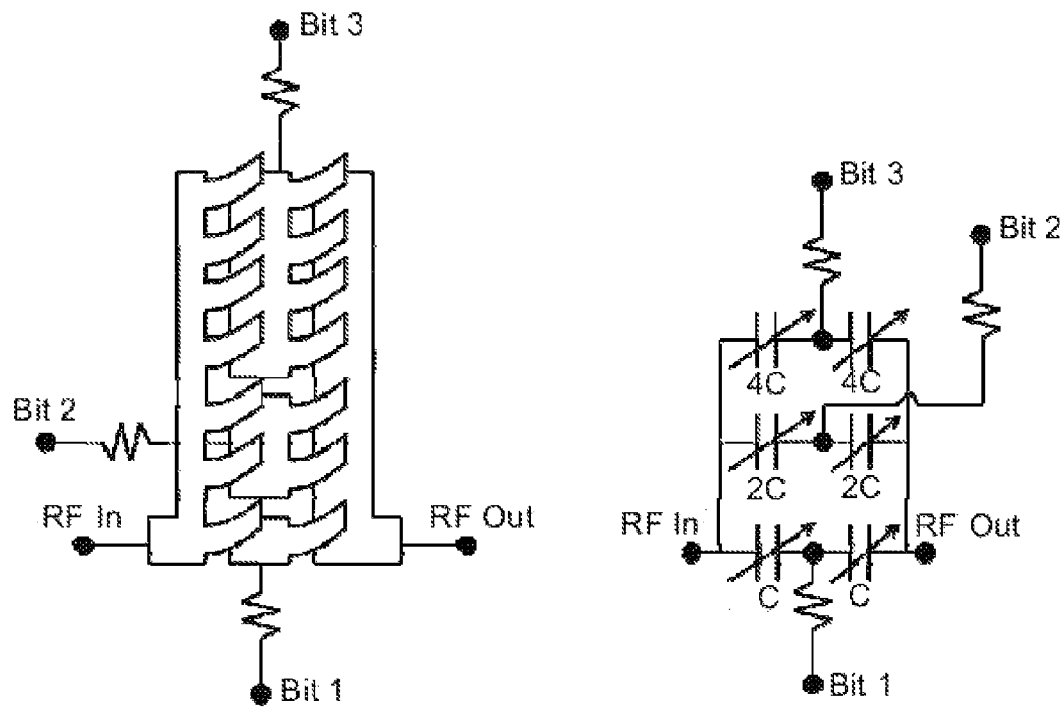
FIG. 4 is an example of a 3 bit network of MEMS switched capacitors.
Figure 5:
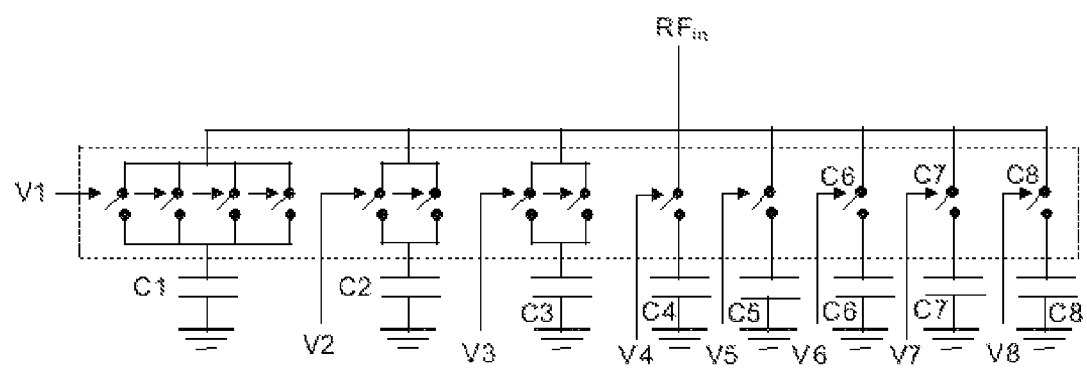
FIG. 5 is an example of a network of capacitors switched by ohmic MEMS, an 8 bit network.

The radio-frequency or RF MEMS network 12 may consist of an array of capacitive MEMS the capacitances of which can be set to a number of values (as shown in FIG. 4) or indeed of ohmic MEMS used to switch a network of fixed capacitors (as shown in FIG. 5). The capacitances Ci are calculated in order to obtain a constant step frequency. The number of capacitors gives the value of the frequency increment. The MEMS components are represented by switches. The capacitors may be placed in parallel and connected to one or more MEMS. The filter is designed to have a constant passband width. This particular structure has a better power withstand than was possible in the prior art. The impedance $R_1$ is given by the following formula: $R_1=\sqrt{2}*Q*L_0*\omega_0$, this impedance is not shown in FIGS. 4 and 5. It is the impedance of the entire oscillating circuit ($L_0$, $C_0$). Where $\omega_0=2*\pi*f0$ and $Q=f0/\Delta f$, f0 being the working frequency and $\Delta f$ being the passband of the filter at −3 dB.

The power passing through the filter obeys the following relationship at the terminals of the oscillating circuit: $P=2 \cdot V_{rms}^2/R_1$ were $V_{eff}$ is the RMS voltage. Peak voltage=$\sqrt{(2 \cdot V_{rms})} V_{peak}=\sqrt{(R_1 \cdot P)}$. The impedance seen by the MEMS is $(R_1)/2$ when the filter is tuned.

For a power P the peak voltage across the terminals of the MEMS is a maximum at the maximum frequency with an amplitude equal to $\sqrt{(R_1 \cdot P/2)}$.

To maximize the power withstand of the filter, it is necessary to decrease the value of $R_1$ and therefore alter the design of the filter, the value of the capacitance of the MEMS increases as $R_1$ decreases. The MEMS filter thus defined may accept high powers. To further increase the admissible power of the filter it is possible to place a number of MEMS in parallel.

In FIGS. 3 and 5, the control signal actuating the MEMS is modeled by the voltages $V_1$ to $V_8$, which select the capacitance to apply in the filter to obtain the desired frequency.

In FIG. 4, the actuating control signal is modeled by bits Bit1, Bit2, Bit3. The variable capacitance $C=2^nCs$, where Cs is the capacitance of a basic element that can take 2 values. The total capacitance is then the sum of the capacitances of the arrays in the low state $C_0$ and the capacitances of the arrays in the high state $C_1$. In the case of a 3 bit capacitance, the capacitance corresponding to the binary value "101" is equal to $C=4C_0+2C_1+C_0$.

In FIG. 5, the actuating control signal has an 8 bit capacity. The ohmic MEMS network allows the capacitors $C_1$ to $C_8$ to be selected, which capacitors have 8 different capacitances. In this case the frequency increment value of the filter is $2^8=256$.

Numerical Example of a Device According to the Invention

For a filter with a passband of 50 MHz, the frequency range to cover is from 950 to 2300 MHz.

Attenuation at F0+/−100 MHz>20 dB

Attenuation at F0+/−200 MHz>35 dB

With an 8 position MEMS switch it is thus possible to obtain $2^8=256$ steps.

Since the frequency range is 1.35 GHz, with such a step it is possible to increment frequency in steps of about 5.3 MHz. This step is compatible with the desired passband.

The minimum crossover must be such that the central frequency of the first step corresponds to 2300 MHz-25 MHz for optimal crossover in the band at 0.5 dB for the filter. Thus, a "box of weights" comprising 8 elements is used for an overestimate of 20% and to provide some latitude in the band covered by the device i.e. for the following steps:

| | Step | | | | | | | |
|---|---|---|---|---|---|---|---|---|
| | 1 | 2 | 3 | 4 | 5 | 6 | 7 | 8 |
| Capacitance pF | 5 | 2.5 | 1.25 | 0.625 | 0.312 | 0.156 | 0.08 | 0.04 | the passband of the filter is almost constant. The desired passband of about 50 MHz is obtained at the minimum and maximum frequencies, the filter width being larger (64 MHz) midband:

| | Combination of steps | | | | | | |
|---|---|---|---|---|---|---|---|
| | 0 | P8 | P7 | P8 + P7 | P6 | P5 | P4 |
| Frequency (MHz) | 2300 | 2273 | 2248 | 2223 | 2202 | 2115 | 1967 |
| Loss dB | 2.843 | 2.719 | 2.616 | 2.518 | 2.463 | 2.254 | 2.064 |
| Passband MHz | 47 | 48 | 48 | 51 | 50 | 51 | 60 |

| | Combination of steps | | | | |
|---|---|---|---|---|---|
| | P3 | P2 | P1 | P1 + P2 + P5 + P7 + P8 | ALL ON |
| Frequency (MHz) | 1743 | 1454 | 1144 | 950 | 861 |
| Loss dB | 2.028 | 2.26 | 2.81 | 2.447 | 2.307 |
| Passband MHz | 64 | 63 | 57 | 50 | 51 |

The filter covers a frequency band ranging from 861 MHz when all the capacitors are activated (activation of all the MEMS) to 2300 MHz when all the MEMS are deactivated.

Figure 6:
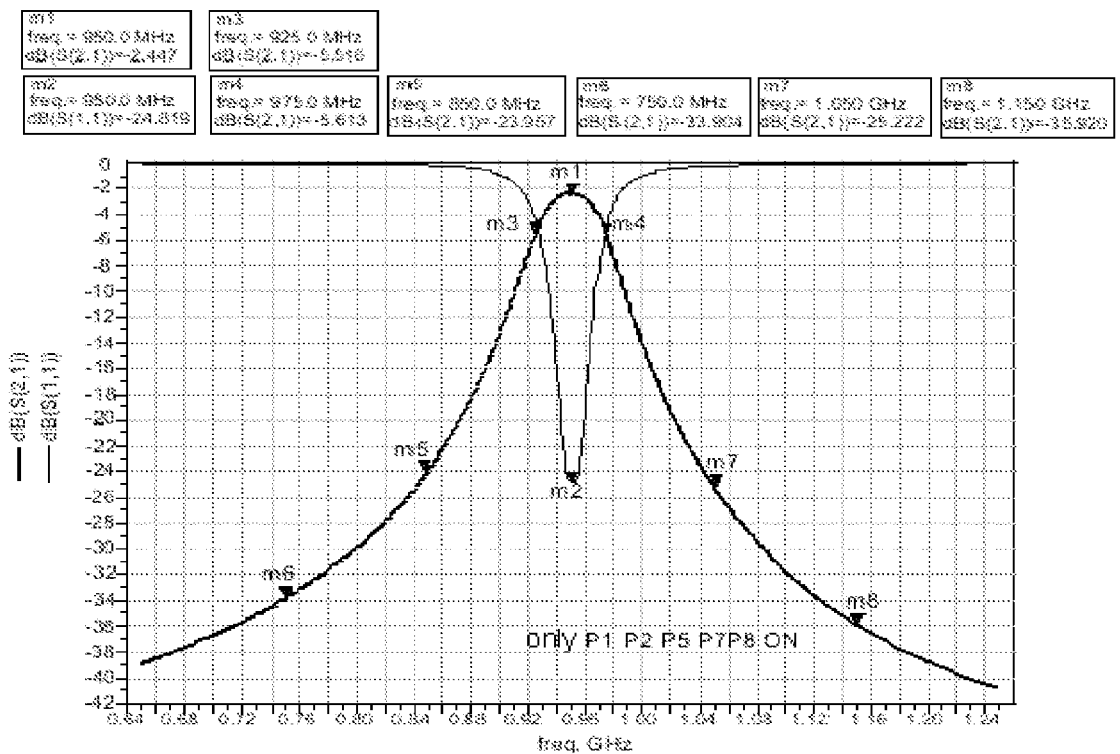
FIG. 6 shows an example transfer function for the filter at a frequency of 950 MHz.
Figure 7:
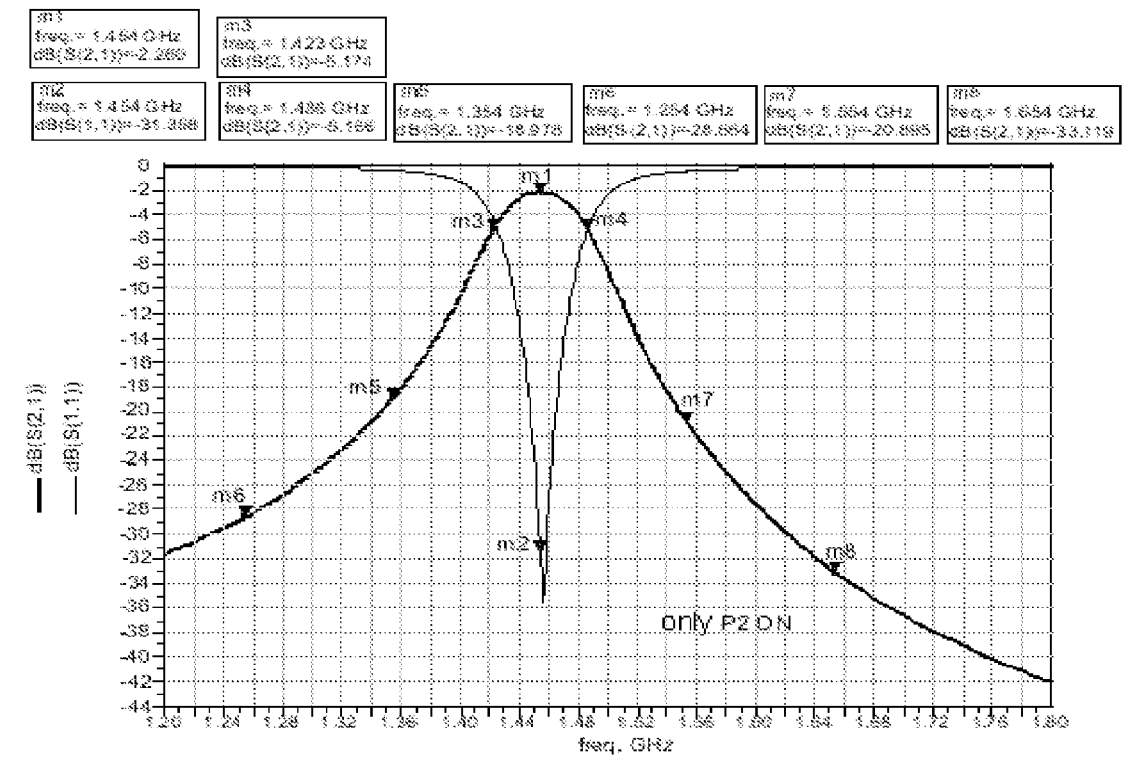
FIG. 7 shows an example transfer function for the filter at a frequency of 1454 MHz.
Figure 8:
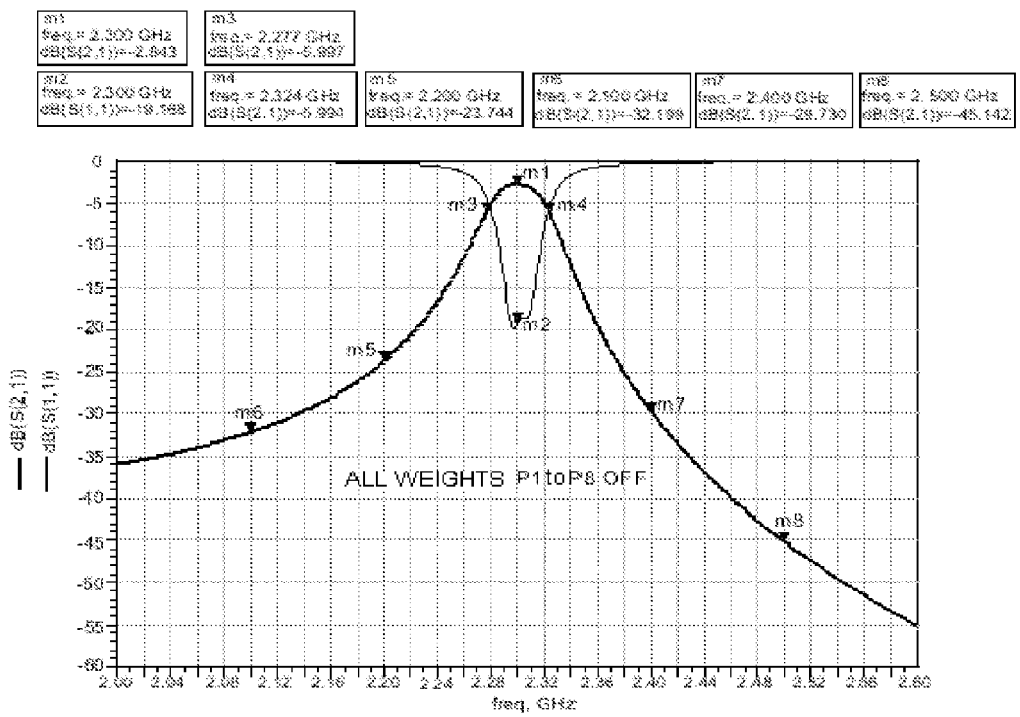
FIG. 8 shows an example transfer function for the filter at a frequency of 2300 MHz.

FIGS. 6, 7 and 8 show the transfer function dB(S(2, 1)) and matching dB(S(1, 1)) obtained for the filter at three central frequencies: 950 MHz, 1454 MHz and 2300 MHz (s parameters $s_{21}$ and $s_{11}$ well known in the art). These figures show that a degree of performance is obtained over a very wide frequency band.

Figure 9:
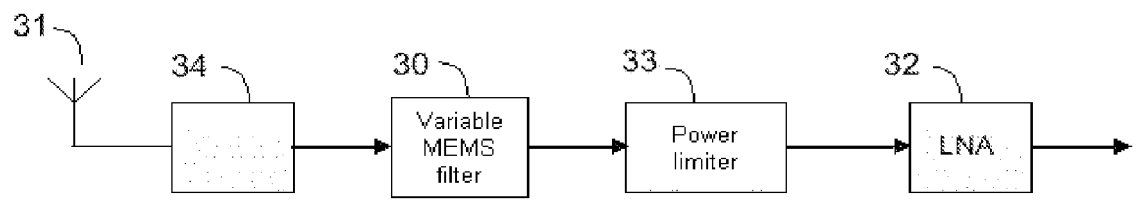
FIG. 9 is an example type 1 receiver architecture.

FIG. 9 shows a first embodiment in which a tunable filter 30 according to the invention is placed furthest upstream in a receiver chain closest to a receiving antenna 31 and just before a low noise amplifier (LNA) 32 between the filter and antenna. The tunable MEMS filter has the advantage of minimizing losses, thereby guaranteeing that the receiver has a low noise factor and a power level sufficient to protect the receiver from high-power out-of-band jamming signals. Only part of the high-field protection, voltages higher than 30 volts, will remain at the antenna 31, lightning protection device 34, the other part of the field protection will be installed just in front of the LNA amplifier 32 with a power limiting device 33 protecting the LNA but only in the passband of the filter.

Figure 10:
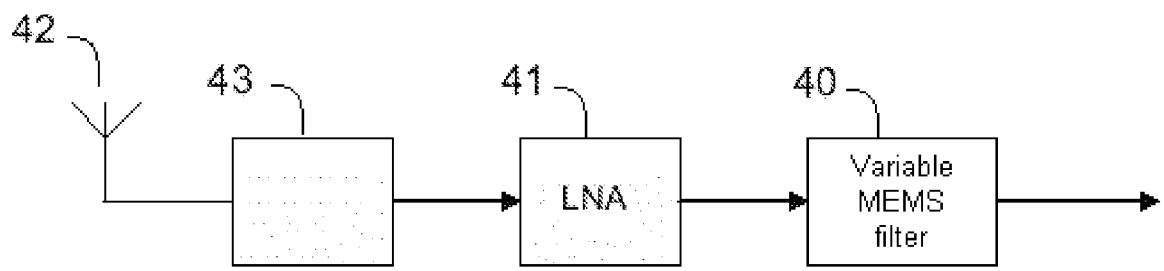
FIG. 10 is an example type 2 receiver architecture.

FIG. 10 is another embodiment of the filter 40 according to the invention. This example architecture is used when the sources of high-field are a little further away and the fields in question will not be as high; such an architecture allows immunity to medium distance jamming (1 to 5 MHz) to be improved via use of a more selective tunable filter and therefore a smaller frequency separation, for instance in the case where a number of transceivers are used on the same site. The tunable filter 40 according to the invention will be placed downstream of an LNA 41 and of a high-field protection device 43 and of an antenna 42.

Figure 11:
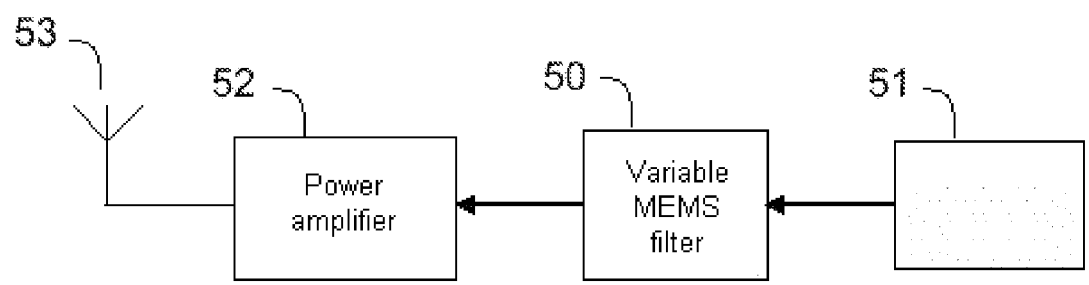
FIG. 11 is an example emitter.

Regarding use in an emitter (FIG. 11), inserting the tunable filter 50 according to the invention in a medium-power emitter chain will allow wide-band noise to be improved beyond the passband of the filter, which is placed between the power driver or controller 51 and the amplifier 52 connected to the antenna 53. Another important point is that maximum applicable RF power must be taken into account when used in an emitter. This allows waveforms with nonconstant envelopes, such as those used in OFDM, to pass through these filters without EVM degradation, because the advantage of the filter is that it is very linear. In a transceiver station, the same filter may be used both for transmission and reception.

A notable advantage of the invention is that it provides a device having a capacitance that can be made to vary over a very wide range by switching capacitors, thereby allowing a wide band to be covered.

It also provides devices having the following improvements:
- a lower filter loss;
- an improved filter selectivity;
- a wide band coverage;
- very rapid frequency changes (agility);
- an almost constant passband;
- a better linearity than in the prior art;
- a negligible current consumption; and
- a much higher admissible power than varactor filters, which are limited in voltage by the value of their control voltage, which, because of the large frequency variation of the device, may have low values of 1 to 2 volts.

The voltage applied to the MEMS component may be quite high and, as intermodulation performance is excellent, a rather substantial improvement in jamming immunity may be obtained and the filter according to the invention may be used for medium-power emissions (about 5 to 10 watts).

In this power field, adjustable filters using fixed capacitors actuated by p-i-n diodes in the tuning system have admissible powers similar to the present device, but at the cost of the high electrical power consumption required to keep the p-i-n diodes on.

In the device presented, very little power is required to turn a MEMS on, which is one of the advantages of this device.

The invention claimed is:

1. A tunable filter comprising:
at least two resonator circuits including a first resonator and a second resonator placed between a first matching network connected to a first input/output and a second matching network connected to a second input/output, wherein said first and second matching networks include an inductor and a capacitor connected in parallel, and in that:
the first resonator of the at least two resonator circuits is connected at a first of its ends on one side to a ground plane (M) of the tunable filter by metallized holes and at a second end to a Micro Electro-Mechanical System (MEMS) network in a plurality of MEMS networks;
a distance (d) between the first resonator and the second resonator forms an inter-resonator inductive coupling circuit;
an inter-resonator coupling capacitor is formed by two etched lines that are connected to the first and second resonators, respectively;
the MEMS networks are distributed around the ends of the first resonator and the second resonator;
the MEMS networks are connected between the first resonator and the second resonator and the ground plane (M) by virtue of vias or metallized holes; and
the tunable filter comprises a number of independent electrical control voltages (Vi) adapted to actuate the MEMS.

2. The tunable filter as claimed in claim 1, wherein microstrip technology is used for the tunable filter.

3. The use of a tunable filter as claimed in claim 1 in a receiver chain, said tunable filter being placed closest a receiving antenna and just before a low noise amplifier.

4. The use of a tunable filter as claimed in claim 1 in a receiver chain, said tunable filter being placed downstream of a low noise amplifier and of a high-field protection device and of an antenna.

5. The use of a tunable filter as claimed in claim 1, said tunable filter being placed between a power driver or controller and an amplifier.

* * * * *